(12) United States Patent
Kearns

(10) Patent No.: US 7,835,153 B2
(45) Date of Patent: Nov. 16, 2010

(54) HEAT SINK MOUNT FOR PROVIDING NON-RIGID SUPPORT OF OVERHANGING PORTIONS OF HEAT SINK

(75) Inventor: Donald A. Kearns, San Diego, CA (US)

(73) Assignee: Oracle America, Inc., Redwood City, CA (US)

( * ) Notice: Subject to any disclaimer, the term of this patent is extended or adjusted under 35 U.S.C. 154(b) by 96 days.

(21) Appl. No.: 12/345,801

(22) Filed: Dec. 30, 2008

(65) Prior Publication Data

US 2010/0165578 A1 Jul. 1, 2010

(51) Int. Cl.
*H05K 7/20* (2006.01)
*F28F 7/00* (2006.01)
*H01L 23/34* (2006.01)

(52) U.S. Cl. ............ 361/719; 165/80.2; 165/185; 257/719; 361/704

(58) Field of Classification Search ......... 257/718–719; 361/719–720
See application file for complete search history.

(56) References Cited

U.S. PATENT DOCUMENTS

| | | | |
|---|---|---|---|
| 4,546,408 A * | 10/1985 | Rodseth et al. | 361/720 |
| 5,754,400 A * | 5/1998 | Sathe et al. | 361/704 |
| 6,418,018 B1 | 7/2002 | Lo | |
| 6,424,527 B1 | 7/2002 | Bailey et al. | |
| 6,472,742 B1 * | 10/2002 | Bhatia et al. | 257/713 |
| 6,501,658 B2 * | 12/2002 | Pearson et al. | 361/709 |
| 7,468,889 B2 * | 12/2008 | Su | 361/719 |
| 7,626,822 B2 * | 12/2009 | Ma et al. | 361/719 |
| 7,679,917 B2 * | 3/2010 | Deck et al. | 361/719 |
| 2005/0072558 A1 * | 4/2005 | Whitney et al. | 165/80.3 |
| 2007/0230136 A1 | 10/2007 | Chen | |
| 2008/0055865 A1 | 3/2008 | Yeh | |
| 2008/0158827 A1 | 7/2008 | Yang | |
| 2008/0239678 A1 | 10/2008 | Ploeg et al. | |

* cited by examiner

*Primary Examiner*—Gregory D Thompson
(74) *Attorney, Agent, or Firm*—Marsh Fischmann & Breyfogle LLP; Kent A. Lembke

(57) ABSTRACT

A computer adapted for force-air cooling of a processor. The computer includes a board supporting the processor and a heat sink mounted such with its base plate contacting the processor. A primary mount supports the heat sink near the processor, and a portion of the heat sink base plate extends outward a distance or overhang length from the primary mount to an edge. The apparatus includes a secondary heat sink mounting assembly supported upon the processor board that includes a damping element with an resilient body positioned proximate to the edge of the base plate, whereby the body abuts the base plate during movement of the base plate toward the board, e.g., upon application of a dynamic or shock load that causes the overhanging portions of the base plate of the heat sink to vibrate or oscillate about the support locations of the primary mount.

10 Claims, 9 Drawing Sheets

HEAT SINK MOUNT FOR PROVIDING NON-RIGID SUPPORT OF OVERHANGING PORTIONS OF HEAT SINK

BACKGROUND OF THE INVENTION

1. Field of the Invention

The present invention relates, in general, to methods and systems for cooling processors (e.g., central processing units or CPUs) in servers and other computing devices, and, more particularly, to methods, assemblies, and components for mounting heat sinks in desired heat transfer contact with a CPU while allowing for manufacturing tolerances and for stresses and/or forces applied to the heat sink during shipping and operation of the computing device.

2. Relevant Background

Removal of heat has become one of the most important challenges facing computer designers as failure to adequately cool devices can cause failure or operating problems. The rate of power dissipation from electronics components such as from processors (or CPUs) in high-performance server units continues to increase. In most cases, air cooling is used to remove heat from a heat generating surface of a CPU, a motherboard, and other components of the server or other computer/electronic product, with each chassis or box containing the heat generating components including one or more fans that draw air into the chassis or box to provide cooling and allow continued operation of the components. To improve heat removal, a heat sink may be mounted in contact with a top surface of the CPU such that the amount of surface area for transferring heat to the flowing air is increased.

For example, FIG. 1 illustrates a partial sectional view of a server (or other computer system) 100 that is designed to use forced-air cooling with a heat sink 140. The server 100 includes a housing or chassis 110 with a base plate or support element 114 supporting a motherboard or board 120. A CPU 130 is positioned upon the board 120, such as a high capacity processor that generates significant amounts of heat. A heat sink 140 is placed over the CPU 130 with a base 142 in contact with the upper surface of the CPU 130 to allow heat to be transferred to the heat sink 140. Air is forced to flow through the fins 148 of the heat sink 140 to remove heat. The heat sink 140 is attached to the base plate or support element with fasteners 150 and springs 156 providing a primary mount of the heat sink 140 to the chassis 110. To provide more surface area, it is generally desirable to increase the number and height of the fins 148, but the height and other dimensions of the heat sink 140 are limited by the configuration of the chassis 110 and other components in chassis 110. As a result, computer designs often include relatively long heat sinks 140, e.g., 200 to 300 millimeters in length (or width). The primary mounting with fasteners 150 is typically centered on the heat sink 140, and a significant amount of the heat sink 140 may be unsupported or overhanging as shown by the length of the overhang, $L_{overhang}$, in FIG. 1. For example, the overhang, $L_{overhang}$, for some recent heat sink designs has been over 100 millimeters on both sides of the heat sink 140 relative to the supporting fasteners 150 or other supports such as mounting plates or the like. The heat sinks 140 are generally formed of metal such as copper, and the overhanging portion may be relatively heavy, such as several pounds.

Providing mechanical restraints in the mounting of a CPU heat sink, such as heat sink 140, is often a challenge to designers. Designers not only have to try to control forces but also deal with tolerances in mating or interconnected parts (e.g., stresses may be created when components are assembled due to tolerance stack up and the like). In general as shown in FIG. 1, springs are provided in the primary mount of the heat sink to try to control dynamic forces and potential assembly tolerances issues. The primary mount provides controlled static loading to the CPU, including allowance for dynamic loads and tolerances. In such an arrangement, other points of contact with the heat sink are avoided to prevent compromising operation of the spring elements.

In the case of large overhanging portions of a heat sink (e.g., as found in very wide/long and low profile designs), shock and vibration loading is often not well controlled by existing designs. As shown in FIG. 1, the heat sink is supported in a cantilevered manner, which may result in significant forces being applied to the heat sink and/or upon the CPU/support structure as the ends of the heat sink 140 move up and down as shown with arrow 160, with degradation of the thermal interface material (TIM) interface being an important failure mechanism. Rigid attachments are sometimes used to support the ends of the heat sink, but the overhanging portion acts as an effective lever in transmitting forces applied by these rigid restraints to the CPU or its attachments (e.g., assembly of the rigid restraint often applies a downward force upon the end of the heat sink that is transferred or leveraged to the CPU or sink primary mount) and/or causes thermal degradation of the operation of the heat sink.

Hence, there remains a need for enhanced heat sink mounting designs to address issues with overhanging portions of the heat sink. Preferably such heat sink mounts would be adapted to augment, and not replace, primary mounts such as the spring mounts shown in FIG. 1 (e.g., not to withstand main forces but instead to handle forces experienced at or input by the overhanging portion). Further, it may be desirable for the heat sink mounts to address dynamic loading that may occur during shipping such as shock loads if the server is dropped or moved quickly and/or during operations that cause vibrations of the heat sink, which may impart significant forces upon the cantilevered sink (e.g., vibrations at or near resonance may rapidly damage the computing device or its components).

SUMMARY OF THE INVENTION

Briefly, the above and other issues are addressed with a low force mount for use as a secondary or augmentation to a primary mount for heat sinks used to remove heat from processors and other electronics components. The low force mount may be thought of as a secondary heat sink mounting assembly that controls dynamic forces that may be applied to a heat sink during shipping and operations and also provides support of cantilevered or overhanging portions of a heat sink. Heat sinks are often supported proximate to a processor/CPU by a primary mount, but, due to demands for more heat transfer surface area, heat sinks may extend outward from the primary mount significant distances, which creates "at risk" or overhanging portions of the heat sink (or of the base plate or heat transfer plate of the heat sink). Embodiments of secondary heat sink mounting assemblies provided here include damping elements that are used to support one or more overhanging portions of the heat sink near its cantilevered edge(s). The damping elements may take many shapes and sizes, but the damping elements or dampers generally include a body formed of or including elastomeric material, such as low durometer rubber, that abuts the base plate of the heat sink to absorb energy (e.g., to dampen vibrations) from the heat sink and to allow for manufacturing/assembly tolerances (e.g., avoid applying a static load on the heat sink as occurs with some rigid support designs).

More particularly, an electronics apparatus such as a computer is provided that is adapted for forced-air cooling of one or more processors/CPUs. The apparatus includes a board or chassis (e.g., a support element) supporting the processor and a heat sink mounted such that its base plate is in contact with the processor. A primary mount may be used to support the heat sink near the processor, and a portion of the heat sink base plate extends outward a distance (an overhang length) from the primary mount to an edge of the base plate. The apparatus further includes a secondary heat sink mounting assembly supported upon the processor board (or chassis). This mounting assembly includes a damping element with an elastomeric body positioned proximate to the edge of the base plate such that it abuts the base plate during movement of the base plate toward or away from the board (e.g., upon application of a dynamic or shock load that causes the overhanging portions of the base plate of the heat sink to vibrate or oscillate about the support locations of the primary mount). In some embodiments, two or more of the damping elements are provided in the secondary mounting assembly, and the damping elements may be supported upon a bracket (which is attached to the board) such that the damping elements abut the bottom of the heat sink plate or extend through a hole/passage through the plate.

DETAILED DESCRIPTION OF THE PREFERRED EMBODIMENTS

Figure 1:
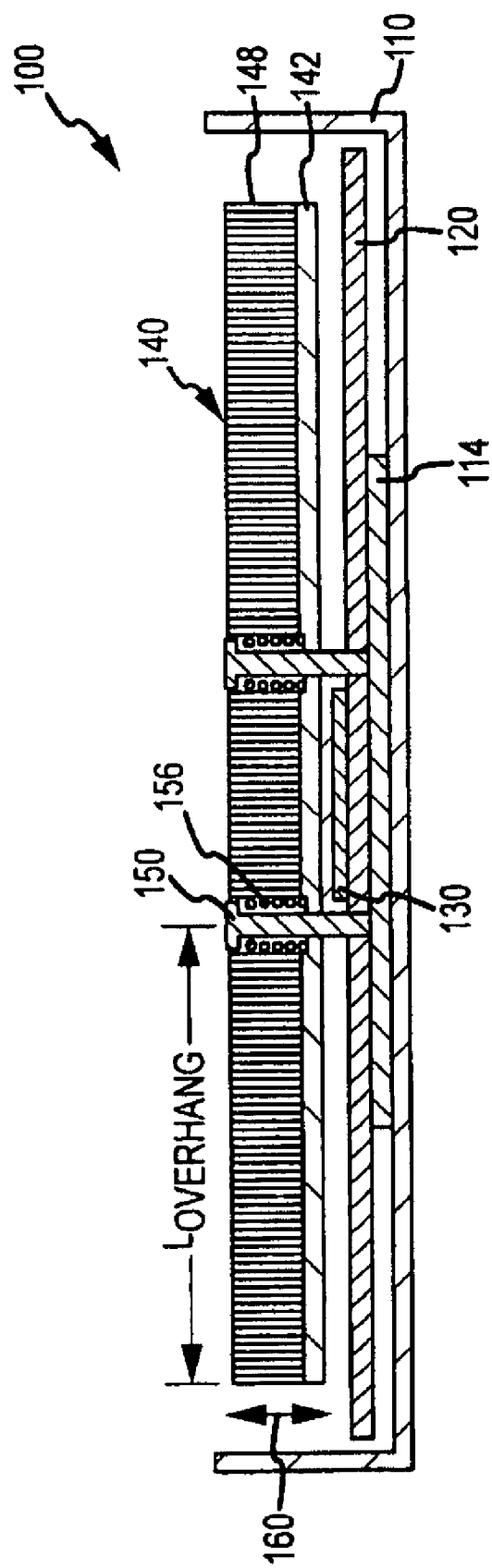
FIG. 1 illustrates a prior heat sink mounting arrangement for a server or other computing device showing an overhanging and unsupported portion of a heat sink.

Briefly, embodiments of the present invention are directed to mounting assemblies for use with heat sinks that are used to cool electronic components, e.g., a CPU or the like, within a chassis or box such as a computer system/server housing. The mounting assemblies may be thought of as low-force, outboard heat sink mounts that are provided to augment primary heat sink mounts (and, typically, to not interfere or effect these primary mounts) to absorb dynamic forces experienced by outboard or overhanging portions of heat sinks. The present invention is also directed toward computing devices such as servers that incorporate the heat sink mounting assemblies described, and the following description illustrates partial views of such computing systems to stress features of the mounting assemblies. However, it should be understood that these assemblies can be implemented to modify the computing system 100 of FIG. 1 (e.g., the mounting assemblies may be used to supplement the primary mount shown in FIG. 1) or nearly any other computing or electronic device utilizing a heat sink with an overhanging portion.

The outboard sink mounting assemblies are not a primary mount for a heat sink but instead are used to augment the primary mount and do not need to be designed to withstand larger or main forces associated with supporting the sink in a computer chassis. The mounting assemblies, hence, are configured to provide a damping element or member (or members in some cases) that is placed in abutting contact with an outboard or overhanging portion of a heat sink to reduce cantilevered loading but also to control dynamic loading or shock loads that may occur during shipping and, in some cases, during operations that produce vibrations (e.g., may excite the sink at or near resonance). For example, a heat sink may be primarily supported by a centered or off-center primary mounting device (e.g., the spring-based device shown in FIG. 1), and the heat sink may have an overhanging portion extending a distance or length outward or outboard from the primary mounting of up to 100 mm or more.

In existing devices, rigid mounting may be utilized to support these overhanging portions of the sink, but rigid supports require precise manufacturing and tolerances to avoid creating lever effects. It is desirable, though, to avoid pushing on the heat sink, during fabrication or after shipping, near the cantilevered, overhanging portions to avoid deflecting the primary assembly and/or potentially damaging the heat sink (which is often fragile/brittle) or the CPU. Embodiments of the low force, outboard heat sink mounting assemblies described herein absorb or dampen dynamic forces without affecting the primary assembly. The assemblies generally provide for relatively high variances in part size and/or location to assist assembly (e.g., do not require precise machining and accurate assembly to properly operate and avoid applying unwanted forces upon the primary assembly as is sometimes the case with rigid supports). The assemblies avoid unintended loading, which may occur with rigid supports such as due to changes in temperatures and changes in dynamic loading.

Figure 2:
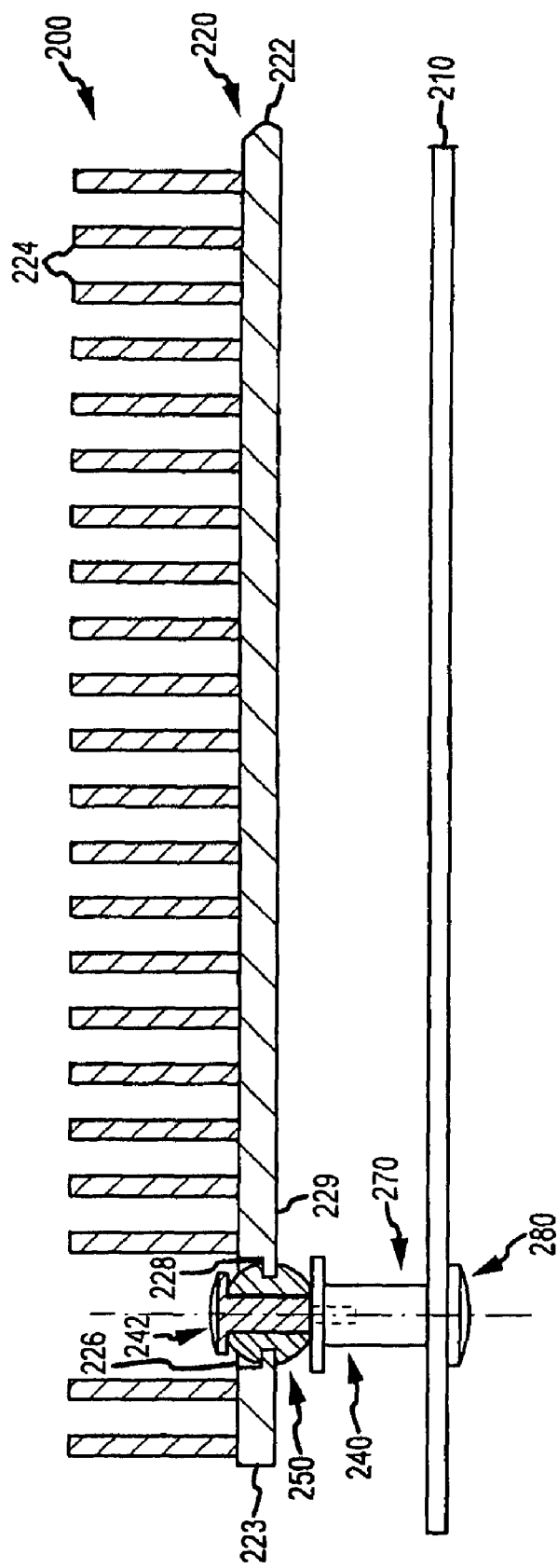
FIG. 2 is a partial sectional side view of a computing device, such as a server, including a heat sink mounting assembly of one embodiment of the invention using a damping element to support an overhanging portion of a heat sink (e.g., a heat sink mounted in a server or other computing device to cool a CPU or other electronic component)

FIG. 2 illustrates a partial view of a computer system or product 200 (such as server or computer as shown in FIG. 1) including a mother or CPU board 210 and a heat sink 220. The heat sink 220 includes a base plate 222 that typically would be positioned in the system 200 to have its contact surface 229 in contact with a heat generating electronic component such as a CPU or the like (not shown but considered part of the system 200). Fins 224 extend upward from the plate 222 from a side opposite the contact surface 229, and air is forced through the fins 224 to transfer heat away from the beat sink 220 via fans (not shown) that may be included in system 200. FIG. 2 illustrates an overhanging portion of the sink 220 that is unsupported by a center or primary support (not shown in FIG. 2 but may be similar to that shown in FIG. 1), and this overhanging portion 220 is spaced apart a distance from the board 210 such that it is supported about an end or in a cantilevered manner by the primary support.

To control dynamic and other forces experienced by the overhanging portion of the heat sink 220, the system 200 includes one or more outboard heat sink mounting assemblies 240 (or "low force outboard sink mounts"). For example, one mounting assembly 240 may be provided on each side or overhanging (or "at risk") portion of the sink 220 (e.g., a sink may have two overhanging portions extending from a primary mounting location and the CPU or other cooled component), or, in other embodiments, two or more mounting assemblies 240 may be provided on each overhanging portion of the sink 220 (e.g., 2, 3, or more assemblies 240 near the edge or overhanging end 223 of the base plate 222). As shown, the heat sink 220 is modified to eliminate one to three (or more) fins 224 (or a localized portion of such fins) to allow positioning of the assembly 240 in the system. For example, a fin 224 near the end 223 may be removed (or never installed) on the sink to provide a mounting location for the assembly 240 such as a few millimeters from the end 223 (e.g., a location selected to better support overhanging portion of the heat sink 220 without creating too large of a span or creating an unacceptable new overhanging portion toward end 223).

Further, the plate 222 may be modified or adapted to include a recessed surface 226 with a center hole/bore to receive the assembly 240 and allow a mounting element (e.g., fastener 242 (such as a screw) and damping element 250) to pass through the bore of recessed surface 226. The recessed surface 226 also provides a mating or contact surface 228 for mating a damping (or elastomeric) element 250 of the mounting assembly 240 to the heat sink plate 222, with the damping element 250 also contacting the plate 222 upon the heat transfer or CPU contact surface 229. In other embodiments, the recessed surface 226 may be eliminated and a bore simply provided, with the damping element 250 mating with the surface 229 and the mounting surface of the fins 224 (e.g., surface 228 would be the plate surface opposite the surface 229 and the notch 260 of damping element 250 would have a height or thickness, $H_{notch}$, equal to or slightly less than the thickness of the plate 222). The assembly 240 generally includes a pair of fasteners 242, 280 that extend toward each other through the plate 222 and the board 210 to connect the plate to the board 222 and provide support for the overhanging portion 222 proximate to the edge 223.

Significantly, the connection is resilient to damp vibrations and/or shock loading by providing a damping element 250 that provides the contacting surfaces/medium between the board 210 and the plate 222. In other words, the mounting assembly 240 is not a rigid mount of the sink 220 to the board 210 or to a chassis (not shown) of system 200. A spacer or positioning element 270 may be provided to better position and/or vertically support the damping member 250 relative to the board 210 (e.g., such that the element 250 does not have to span the full distance between the board 210 and the sink surface 229). Components such as fasteners 242, 280 and spacer 270 may be formed of rigid materials such as hard plastics, metals, and the like while the damping element 250 is generally formed of an compressible and/or resilient material such as an elastomeric material including, but not limited to, a number of formulations of rubber, plastic, and/or foam. After assembly, the mounting assembly 240 provides vertical support of the sink 220 in the shown overhanging portion, and, when dynamic loading such as vibrations or oscillations occur, the damping element 250 acts to absorb this energy or these varying forces reducing risks of damage to the sink or to the primary mount or CPU.

Figure 3:
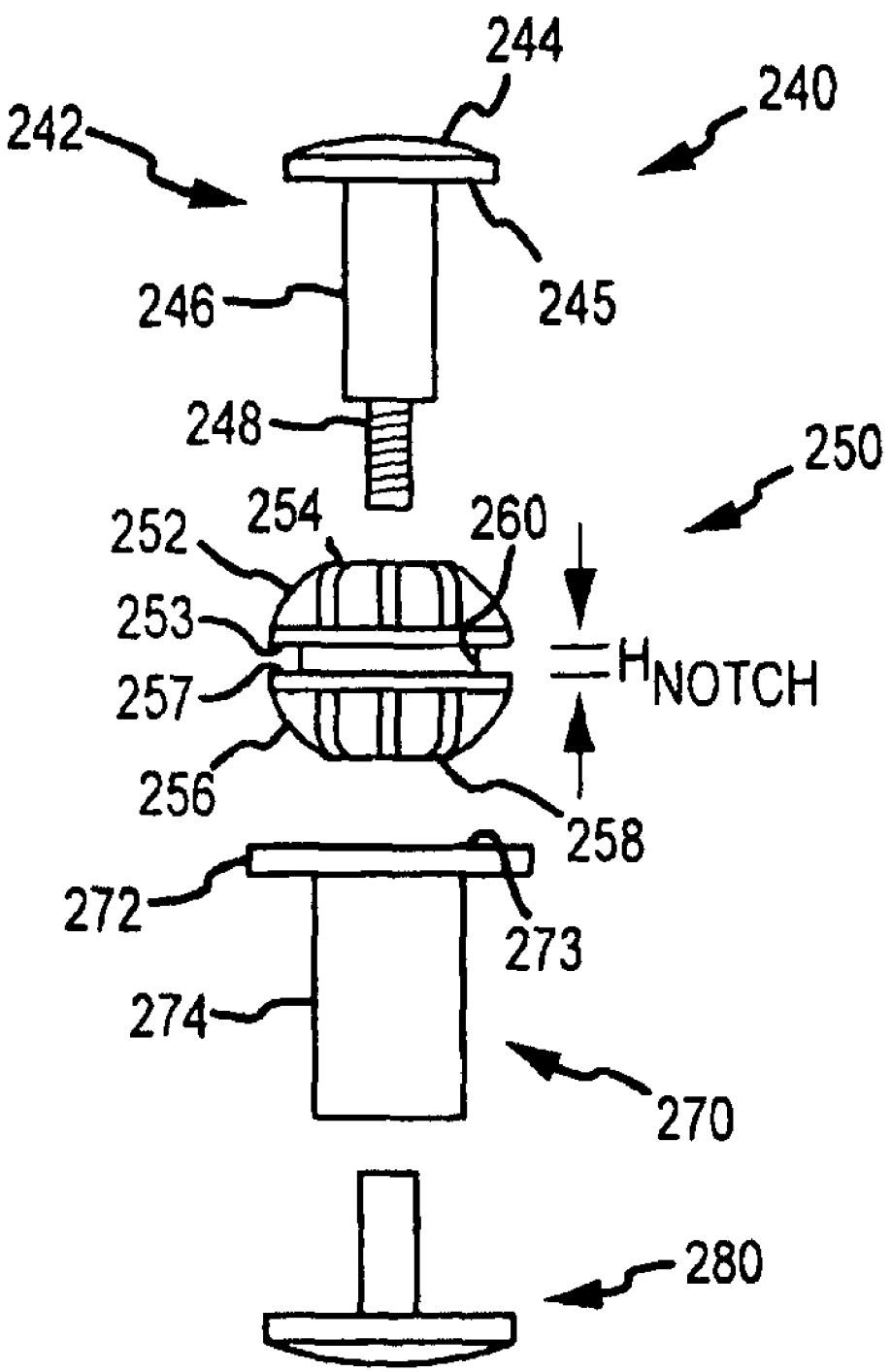
FIG. 3 is an exploded view of the heat sink mounting assembly of FIG. 2.

FIG. 3 illustrates components of the mounting assembly 240 in greater detail. In the form shown, the mounting assembly 240 may be thought of as including a floating damper and shock load reaction system. This "system" is formed of damping element 250, which may be a molded rubber element such as a commercially available rubber or other grommet, a fastener 242 (e.g., a shoulder screw), a standoff 270 with a bearing surface 273, and a fastener 280 (e.g., a screw) for extending through the board 210. The height of the standoff 270 and length of body 274 (e.g., from end that mates with board 210 to the bearing surface element/integral washer 272) are chosen to insure that no significant static loads are generated to the heat sink 220 or to the CPU board 210 on initial assembly of system 200. The damping element 250 includes a lower body 256 with a lower contact surface 258 for abutting on the bearing surface 273 of standoff 270 and with an upper contact or shoulder contact surface 257. The damping element 250 further includes an upper body 252 with an upper contact surface 254 for abutting a surface 245 of the head 244 of fastener 242, with the body 246 of the fastener 242 extending through a hole or chamber (seen in FIG. 2) of the damping element 250 to mate with the fastener 280 with threaded portion 248. The upper body 252 of damping element 250 also includes a lower contact or shoulder contact surface 253.

The damping element 250 further includes a center body or notch portion 260 that has a smaller diameter than bodies 252, 256 to provide a recessed contact surface for abutting the plate 222 in the hole or bore through the plate 222 provided in recessed/receiving surface 226. The notch 260 in the grommet or damping element 250 is the force reacting surface with the sink 220. The damping element 250 is formed of a compressible, resilient material (e.g., a low durometer, damping rubber or the like) such that it may be easily deformed to have the upper or lower body 242, 256 pushed gently through the hole or bore of recessed surface 226 of plate 222 with minimal force applied to the heat sink 220. In some cases, the damping element 250 is pre-applied to the sink 220 prior to its installation to avoid loading the board or CPU. The damping element 250 returns (or attempts to return) to its original form, which causes the plate 222 to be in abutting contact with portions, such as surface 228, 229, of the plate 222 pinched between the shoulder surfaces 253, 257 of upper and lower body portions 252, 256 and center body portion 260 as it tries to return to its original outer diameter. In some cases, the damping element 250 is sized and configured such that it may be installed with relatively small initial compression/deformation, e.g., to allow it to better absorb dynamic loading and vibrations of the plate 222. The center notch or body portion 260 may have a relatively large height, $H_{notch}$, to enhance static, pre-load tolerances.

The dimensions and features of the damping element 250 are preferably chosen to effectively damp vibrations of sink 220. For shock loading, the resilient or damping element 250, formed of rubber or other energy dissipating materials, may be attached to the sink base plate 222 and allowed to move to the extreme positions or over a range of motion (move along a central axis of the assembly 240) that may be defined by the fastener 242 (e.g., a shoulder screw as shown) and standoff 270, limiting travel and reacting forces. In some cases, some float of the grommet or damping element 250 is provided on the fastener 242 to enhance static, pre-load tolerances (e.g., cases where vertical float is considered a key feature to providing a near-zero static loading of the OBM). However, it may also be desirable that the central bore or chamber of the element 250 and outer diameter of body 246 be chosen such that there is sliding friction between these two components (e.g., cause the element 250 to interact with the fastener 242 upon initial assembly of assembly 250, which typically occurs after assembly primary mount to place sink 220 in contact with a CPU on board 210). One or more of these mounts 240 may be implemented at each end of the heat sink 220 (with one typically being placed in a center position along the edge 223 of plate 222), secured to the CPUM board 210 only, and, in some cases, under the cross beam. In other instances, simpler configurations of assembly 250 may be used, e.g., without use of a shoulder screw (with the damping element 250 resting on surface 273 of standoff but not compressed/restrained by surface 245 of fastener head 244), may be used to achieve the support of the overhanging portion of sink 220 on board 210 in a resilient, damping manner, but, in some cases, a tolerable reduction in performance such as in upward shock. The heat sink mount 240 limits deflections of the heat sink 220, controls or limits movement of the surfaces making up the thermal interface between the heat sink 220 and the CPU lid, and reduces stresses to the CPU, thereby enhancing reliability of the CPU and computer. The use of an elastomeric damping element 250 also increases allowable tolerances in assembly (relative to rigid support designs) and avoids static load transfer, while protecting the CPU (not shown in FIGS. 2 and 3) from transient loading.

Figure 4:
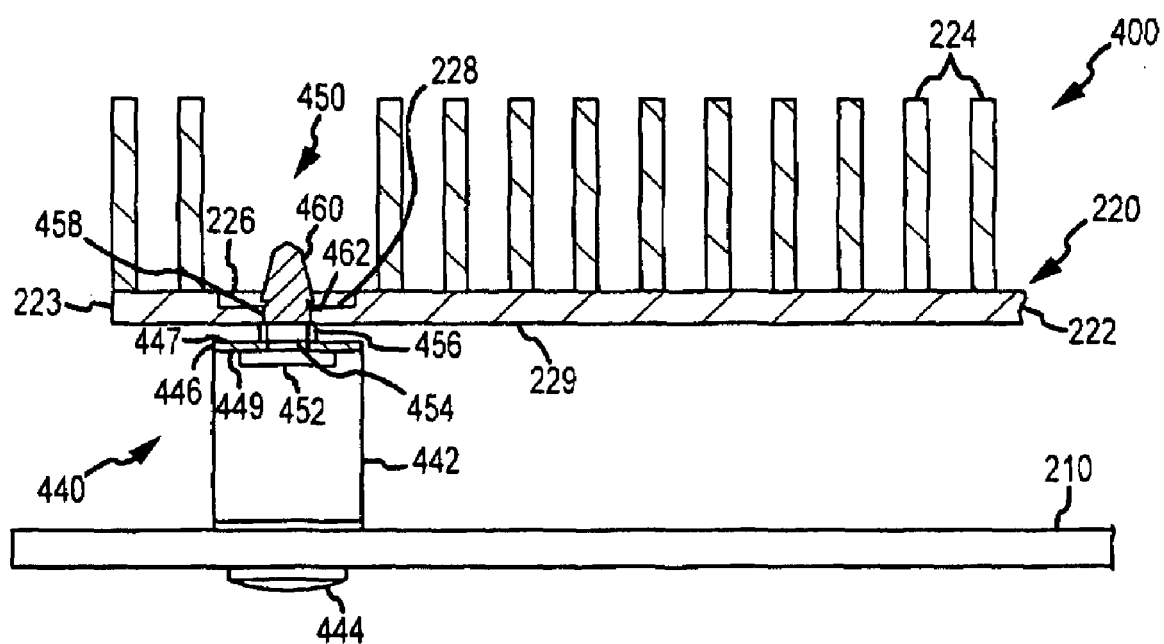
FIG. 4 is a partial sectional side view of a computing device similar to FIG. 2 showing another heat sink mounting assembly according to another embodiment of the invention.
Figure 5:
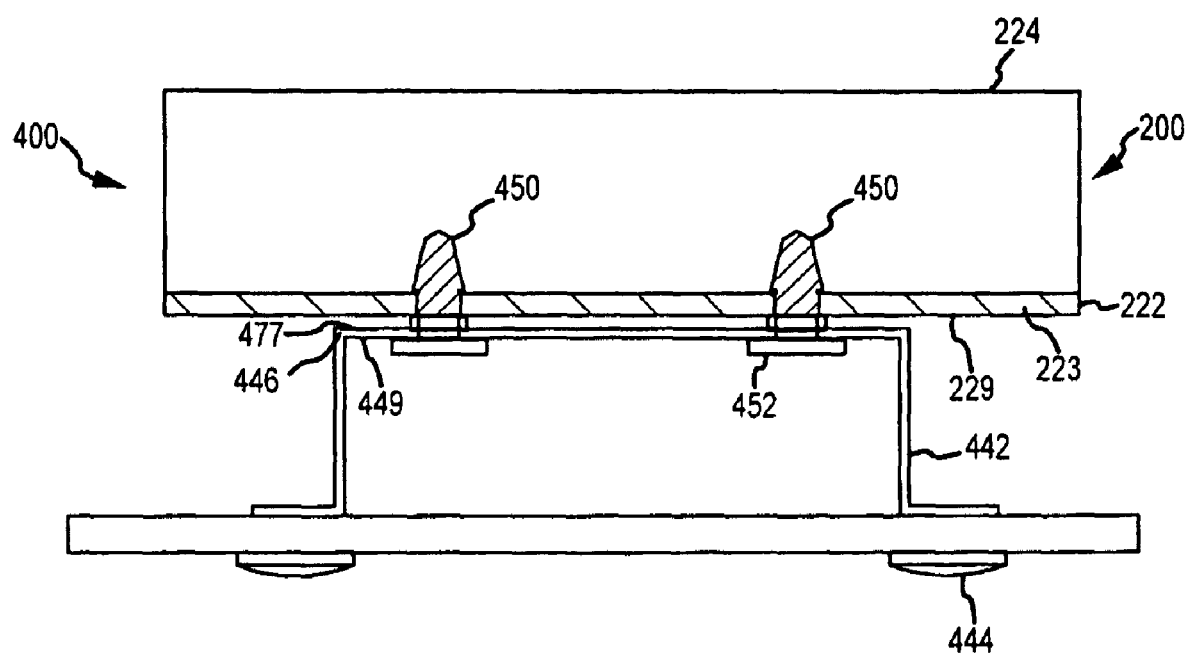
FIG. 5 is an end view of the computing device or system of FIG. 4.
Figure 6:
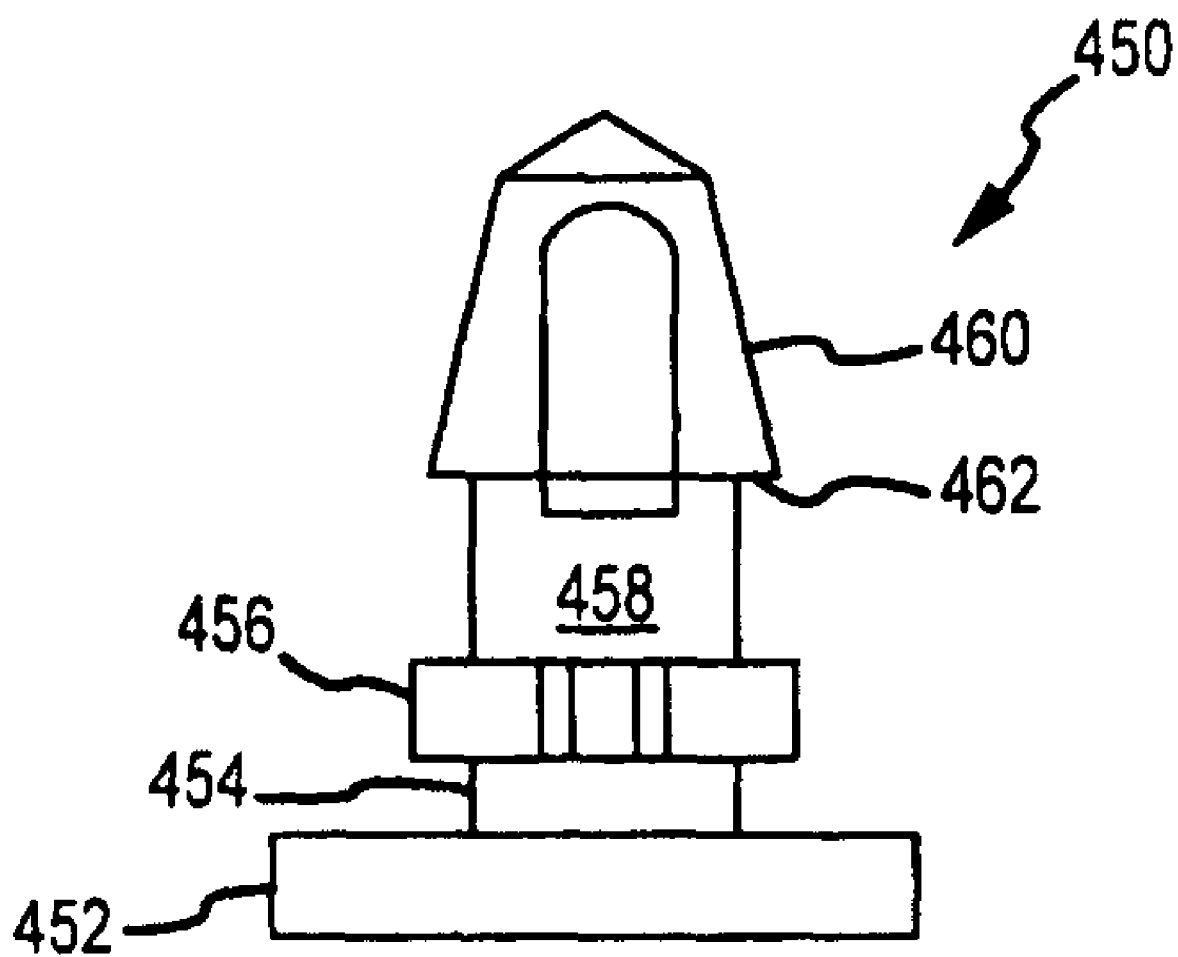
FIG. 6 illustrates in more detail a damping element that may be used in the heat sink mounting assembly of FIGS. 4 and 5.

The general concept of supporting an overhanging portion of a heat sink may be implemented in a number of ways, and the invention is not limited to the embodiment of FIGS. 2 and 3. For example, FIGS. 4-6 illustrate a computer system 400 that provides another embodiment of a mounting assembly 440 for supporting a heat sink 220 on a CPUM board 210. As shown, the assembly 440 includes a pair of damping elements 450 that are each inserted through a bore or hole in a recessed surface 226 of the sink base plate 222. The damping elements 450 are supported upon a bracket 442 with a shelf 446 positioned proximate to the contact surface 229 of the base plate 222 and the edge/end 223 of the plate 222. The bracket 442 also includes a pair of openings/holes through which the damping elements 450 may be pushed/inserted such that the elements 450 are supported upon the shelf 446 near the heat sink plate 222. The dampers or damping elements 450 may be pre-installed upon the bracket 442 from below the shelf 446, and the bracket 442 is installed to the board 210 via fasteners 444, such that the assembly 440 is supported by the board 210.

Referring to FIG. 6, each damping element 450 includes a base 452 upon which a cylindrical body is positioned or extends. The body includes first and second portions 454, 458 of a first outer diameter (e.g., about the size of the holes in the bracket 442 and sink plate 222), and the body includes a first or lower shoulder member 456 that extends outward from the portions 454, 458 (e.g., has a larger outer diameter) to provide retention and/or mating surfaces for abutting the top surface 447 of the shelf 446 of the bracket 442 and the surface 229 of the sink base plate 222. The body of the damping element 450 also includes a head 460 that may generally be frustoconical in shape. For example, the head 460 may be funnel shaped with an outer diameter that increases from a tip to a shoulder or end to provide mating/contact surface 462 for abutting the surface 228 in recessed portion 226 of plate 222. The damping element 450 is typically formed (such as molded) of a resilient or elastomeric material such as, but not limited to, a low durometer rubber, which allows it to be deformed or compressed to have body portions 460 and 456 be inserted through holes of smaller diameter and then expand back to their original or near original sizes to retain the element 450 in place as shown in FIGS. 4 and 5.

As shown in FIGS. 4-6, the bracket 442 is attached to the board 210, and, to complete assembly of system 200, the heat sink 220 is pressed down onto the dampers 450, which provides a resilient or energy absorbing support of the sink plate 222 at or near its overhanging edge 223 on the board 210. The mounting assembly 440 differs in part from assembly 240 in that it includes fewer parts (four parts versus five parts) and, specifically, does not utilize a shoulder screw but instead the damping element 450 provides all/any compression or downward forces upon the upper surface 228 of plate 222. The assembly 440 may provide a reduction in vibration/force control when compared with assembly 240, but it provides the advantage of tool-less assembly/insertion in sink 220. Of course, tuning of the clearances, diameters, shapes of components in the element body, and materials may be used to achieve desired functionality of the assembly 440. Typically, each of these energy-absorbing OBMs require some initial loading upon assembly.

Figure 7:
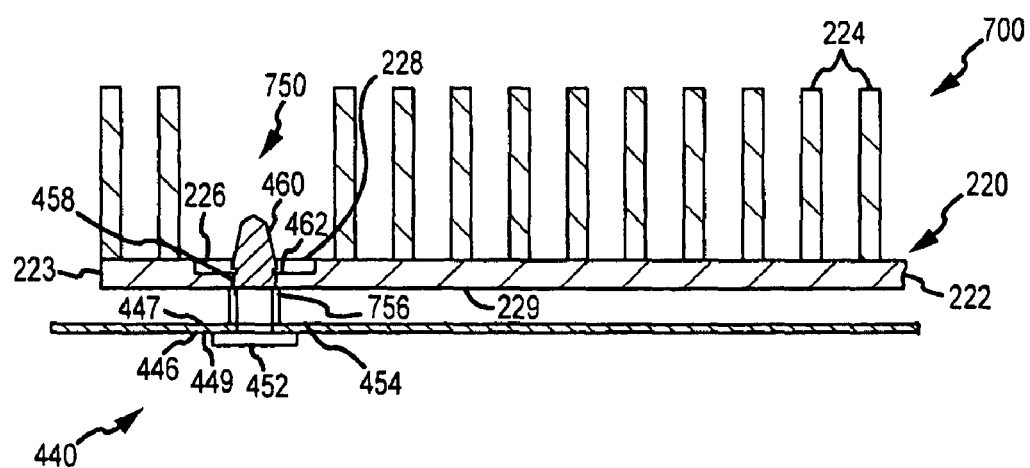
FIG. 7 is a view similar to FIG. 4 of a computing device in accordance with an embodiment of the invention without use of a mounting bracket and direct connection between board and heat sink.

In some applications, there may not be a need or a desire for a mounting bracket, and, in such cases, the damping element may be directly linked to both the CPU board and the heat sink base plate. FIG. 7 illustrates an embodiment of a computing system 700 similar to system 400 (with components shared between the systems given like element numbers) that eliminates a mounting bracket. The mounting assembly 750 includes a damping element 450, which is formed of a compressible and resilient material such as a foam rubber, with a body that can be inserted through an opening or hole in the board 210 and through an aligned hole in the plate 222 of heat sink 220. In this manner, the sink's overhanging or cantilevered portion near edge 223 is elastically supported by the board 210 to control dynamic and shock loading as well as providing ready and tool-less assembly of system 700. The mounting assembly 750, in this embodiment, is one to three or more damping elements per at-risk or overhanging portion of the sink 220. The damping element may take a form similar to that shown in FIGS. 4-6, but it may include a first or lower shoulder element 756 that is significantly larger, e.g., to be about the anticipated separation distance between the upper surface of the board 210 and the contact surface 229 of sink base plate 222. Also, the height of the first or lower body portion 454 may be chosen to match (with desired tolerances) the thickness of board 210.

In some embodiments, it may be useful to provide a damping stop rather than a damping element that applies restraining forces on both upper and lower surfaces of a heat sink. In other words, there may be some cases where a resilient stop may be provided below an overhanging portion of the heat sink to limit downward travel of the at-risk portions of the sink. Such an embodiment eliminates the need to apply any forces to the sink during assembly at the outer edges as the damping element does not need to be forced through the sink base plate, and this may be important when the overhang is large and/or the plate (or in contact CPU or primary support) are susceptible to damage from leveraged forces (e.g., the plate may be more fragile/brittle or the like). Such an embodiment also provides a support for overhanging portions that may be installed prior to installation of the heat sink and would require no further assembly.

Figure 8:
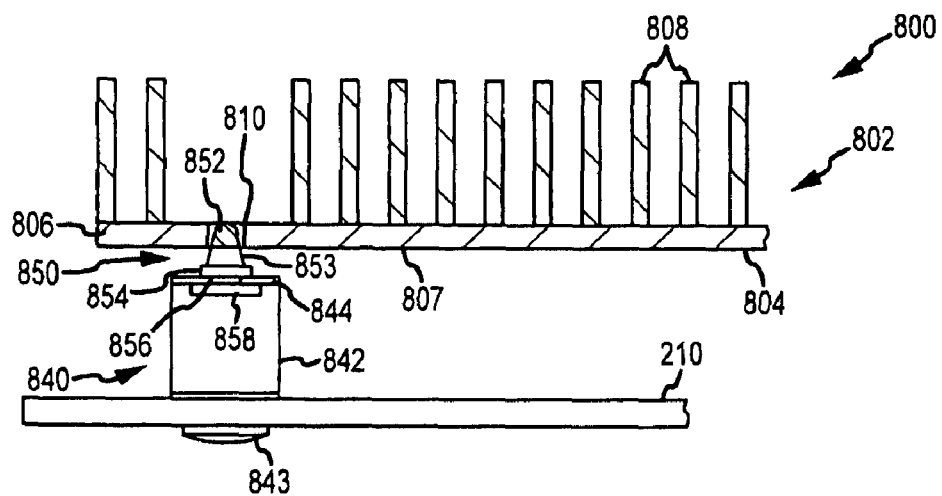
FIG. 8 illustrates a view similar to FIG. 4 of a computing device in accordance with an embodiment of the invention with an outboard heat sink mounting (OBM) assembly including a damping limit stop.
Figure 9:
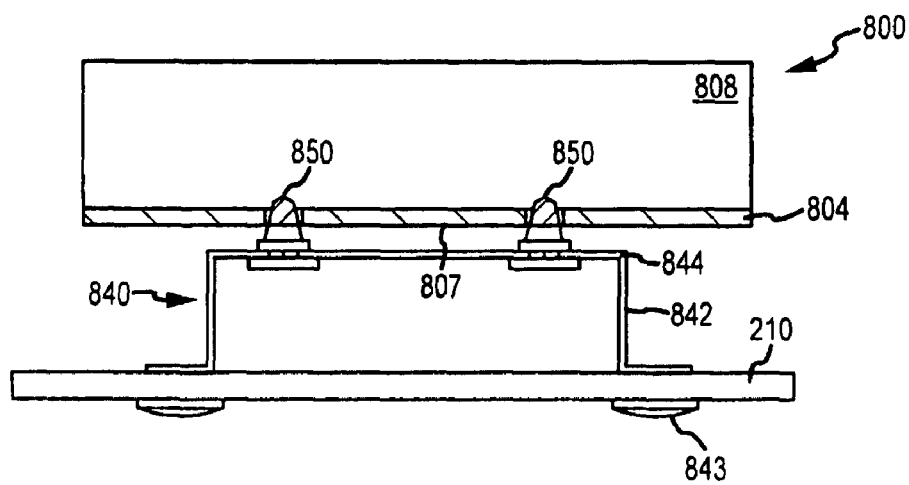
FIG. 9 is an end view of the computing device of FIG. 8.

FIGS. 8 and 9 illustrate one embodiment 800 of a computer system that includes a heat sink 802 with a base plate 804 from which fins 808 extend to provide cooling to a CPU or other component (not shown). The heat sink 802 is supported vertically by a primary mount (not shown in FIGS. 8 and 9 but may be similar to that shown in FIG. 1 or the like), with an overhanging portion of the plate 804 extending out to an edge or unsupported side/end 806 (or supported only by damping element 850 in some cases where surface 807 is in contact with the element 850). The heat sink 802 is positioned above and spaced apart from a CPUM or similar board 210.

The plate 804 may differ from other plates shown in that it includes a recessed surface or hole 801 accessible from the contact surface 807, but it does not need to include a recessed surface for receiving portions of the damping element 850 or providing a contact surface for applying a vertical restraining force (with the damping element head/should portions extending through the plate 804) or a damping element compressive force (with a fastener, for example). Instead, a hole 810 may be provided that extends partially of fully through the plate 804 may be provided for receiving a tip or upper portion of the head 852 with its contact surface 853 (e.g., the hole or recessed surface 810 may be about the diameter of the tip or another portion of the head 852 (e.g., a diameter midway or another distance from the tip) or the surface 810 may take a shape similar to that of the head 852 (e.g., have inwardly sloping walls rather than vertical walls as shown)).

The system 800 further includes a mounting assembly 840 that acts to limit vertical (e.g., downward) travel of the plate 804 of heat sink 802. The mounting assembly 840 includes a bracket 842 that is affixed to the board 210 via fasteners 843, and the bracket 842 includes an upper shelf 844 with a openings through which a pair of damping elements 850 may be inserted and retained by the shelf 844 of bracket 842. The bracket 842 and the damping elements 850 are positioned proximate to an edge or end 806 of the plate 804, e.g., 5 to 20 millimeters or the like from end 806. When the system 800 is assembled, the damping elements 850 typically extend at least partially upward into the recessed or receiving surface 810 of plate 804, and, in some cases, a contact surface 853 of the limiting portion or head 852 is spaced apart from the plate 804 (e.g., to provide a travel stop to limit vibration issues) while in other cases the contact surface 853 at least lightly abuts the surface 810 of plate 804 to provide at least some vertical support of the cantilevered portion of plate 804 near edge 806.

The mounting assembly 840 includes a pair of damping element 850 on shelf 844. Each damping element 850 may be formed from rubber or other compressible/resilient material. The damping element 850 includes a base 858, which may be in contact with a lower surface of the shelf 844 to resist the upward lifting of the damping element 850 from the bracket 842. A cylindrical body 856 extends upward from this base 858 and is sized based on the hole in bracket 842 (or vice versa) such as to have a diameter that is about the size of the diameter of this bracket hole. In some cases, float of the damper 850 is allowed on the bracket 842. A shelf or retaining member 854 is included above this body portion 856 that has a greater diameter such that its lower surface abuts the upper surface of shelf 844 to resist downward movement of the damping element 850 (e.g., retain element 850 on shelf when the sink 804 applies a downward, compressive force upon the element 850). A head or limit portion 852 is provided above this shoulder 854 and includes a contact surface 853 that is placed near or in abutting contact with the surface 807 and/or recessed or receiving surface 810. A number of shapes (and/or cross sectional sizes) may be used for the head/limit 852, with a conical or frustoconical shape (e.g., a tapered design as shown to reduce static loads being applied by the mounting assembly on the sink and/or tolerance requirements) being useful in some cases to provide a tip that may be received in hole 810 but then abut the sides of hole 810 and/or contact surface 807.

Figure 10:
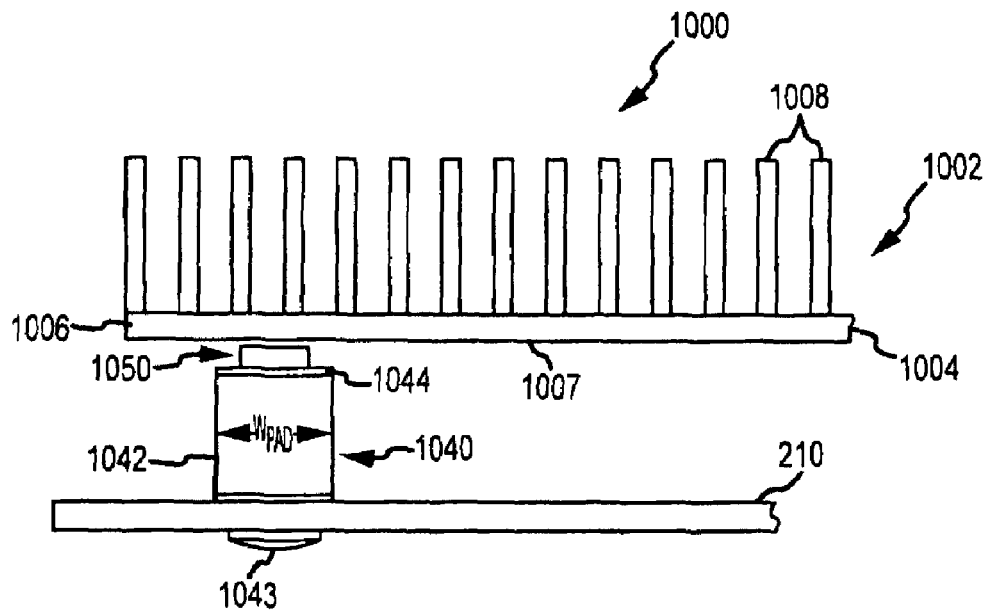
FIG. 10 illustrates a view similar to FIGS. 4 and 8 of a computing device in accordance with an embodiment of the invention with an alternative outboard heat sink mounting assembly including another embodiment of a damping limit stop.
Figure 11:
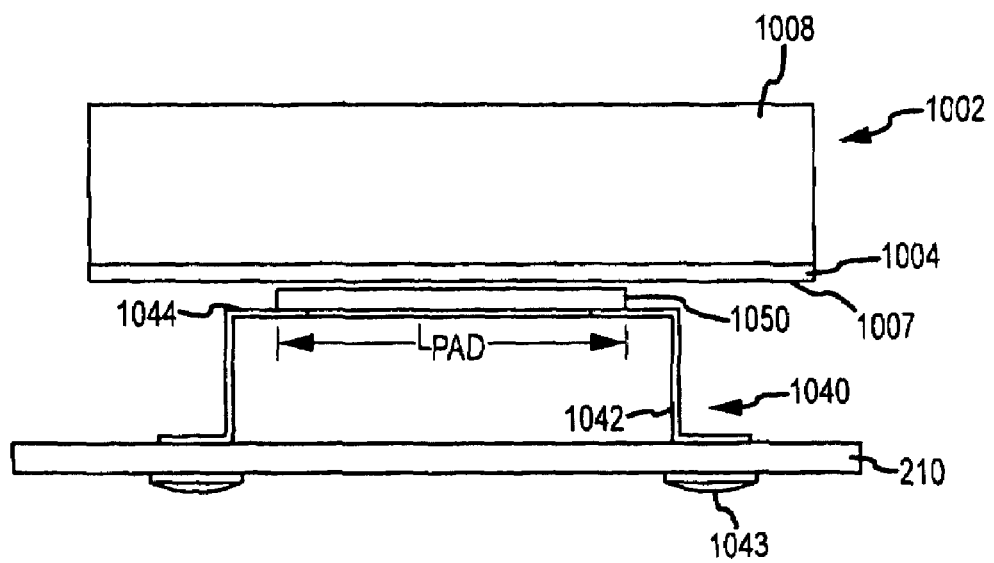
FIG. 11 is an end view of the computing device of FIG. 10.

FIGS. 10 and 11 illustrate another embodiment 1000 of a computer system with a damping limit stop mounting assembly 1040. As shown, the system 1000 includes a heat sink 1002 with a base or heat transfer plate 1004 with cooling fins 1008 extending vertically and with an end or edge 1006 overhanging or "at risk" relative to a primary mount (not shown). The heat sink 1002 differs from other heat sinks shown herein in that it does not include any modification to include a receiving or recessed surface, and this allows it to retain a full complement of fins 1008. Also, the contact surface 1007 may be planar as shown (or, in some cases, it is modified to include a recessed or receiving surface for the damping element 1050).

As shown, the system 1000 includes a mount assembly (which may be considered a limit stop assembly) 1040, with a bracket 1042 extending upward from the board 210 to an upper shelf 1044 and attached to board 210 via fasteners 1043. The shelf 1044 may be substantially planar and arranged to be substantially parallel to the contact surface 1007 of plate 1004. A stop or damping element 1050 is positioned on this planar surface of the shelf 1044 of bracket 1042, e.g., a foam or rubber sheet may be affixed by adhesive or other methods to the shelf 1044. The damping element 1050 may be a sheet or a planar element (as shown) or include an upper textured surface (e.g., with contact ridges for contacting surface 1007). The stop 1050 may be a rectangular component as shown with a width, $W_{pad}$, and a length, $L_{pad}$, chosen to provide an adequate mating surface for the plate 1004. The thickness of the pad 1050 typically is selected based on size of the pad 1050 and expected compressive forces applied by the plate 1004 (e.g., to provide adequate compressive capacity and resilience to limit rigid support by bracket 1042). The pad or limit/damping element 1050 may be sized (along with the height of the bracket 1042) such that the element 1050 is in contact with the surface 1007 upon initial assembly, while other embodiments call for a small gap to be provided such that no upward force is applied to the plate 1004 near edge 1006 during assembly (with this gap being relatively small, though, to provide limited downward movement of the plate 1004 prior to the stop 1050 being engaged/compressed to limit dynamic forces including vibrations).

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed. For example, FIGS. 2-4 illustrate embodiments where the base plate of the heat sink includes a recessed contact surface for mating with the damping element, but such a recessed surface is not required to practice the invention with the secondary heat sink mounting assembly shown in these figures being useful with base plates/heat sinks without such surfaces.

Further, another embodiment (not shown) may be provided with some modifications of the outboard heat sink mounting assembly 240 shown in FIGS. 2 and 3 to allow additional vertical float. For example, the vertical travel or limit stops on the top and/or bottom of the damping element 250 may be removed or eliminated. In one embodiment, the assembly 240 is modified such that shoulder screw 242 is selected to extend through the damping element 250 such that its body or shaft 246 is in contact with the surfaces of the bore in body 260 of damping element 250 but with the surface 245 of the head 244 spaced apart from upper surface 254, whereby the damping element 250 is not limited by the screw from moving vertically. Further, the standoff 270 may be eliminated such that the damping element 250 only contacts the screw body or shaft and is not limited from vertical downward travel toward the board 210 by the standoff bearing surface 273. The screw 242 in this case may thread into a threaded mount on the upper surface of the board 210 or may extend through the board 210.

In this embodiment, there are no limit stops on the top or bottom of the damping element 250. The resistance to dynamic loading (e.g., movement of the overhanging portion of base plate 222) is provided by the sliding resistance between the damping element 250 and the body or screw shaft alone (e.g., inner walls of damping element that are formed of rubber, plastic, foam, or the like are being compressed by the plate 222 toward the shaft of the screw and resist movement vertical movement). In such a case, the inner diameter of the hole or bore extending through the damping element and the outer diameter of the notch 260 are chosen such that adequate radial compression is provided on the damping element 250 (or its internal diameter), whereby a desired amount of friction or sliding resistance is provided to resist vertical travel of the heat sink plate 222.

I claim:

1. An electronics apparatus adapted for forced-air cooling of an electronic component such as a processor, comprising:
    a support element supporting the electronic component;
    a heat sink mounted in contact with the electronic component, the heat sink comprising a base plate with a portion extending outward a distance from a primary mount proximate to the electronic component to an edge; and
    a secondary heat sink mounting assembly supported on the support element comprising a damping element comprising an elastomeric body positioned proximate to the edge of the base plate to abut the base plate during movement of the base plate toward the support element,
    wherein the elastomeric body of the damping element extends through a passageway through the extending portion of the heat sink base plate with an upper shoulder abutting an upper surface of the base plate and a lower shoulder abutting a lower surface of the base plate.

2. The apparatus of claim 1, wherein the mounting assembly comprises a rigid support attached to the support element and extending toward the base plate, the damping element supported by the rigid support with at least a portion of the elastomeric body sandwiched between the rigid support and the base plate.

3. The apparatus of claim 1, wherein the base plate comprises a contact surface facing the processor and wherein the contact surface abuts the elastomeric body applying a compressive force to the elastomeric body upon initial assembly of the apparatus.

4. An apparatus for mounting a heat sink to a board supporting a computer processor, comprising:
    a heat sink comprising a base plate and a plurality of fins extending from the base plate, the base plate comprising a recessed surface proximate to an end of the base plate and a hole accessible via the recessed surface and extending through the base plate; and
    a mounting assembly supported by the board, wherein the mounting assembly comprises a resilient damping element positioned proximate to the edge of the base plate, wherein the resilient damping element comprises an elastomeric body extending through a passageway through the hole in the base plate with an upper shoulder abutting an upper surface of the base plate and a lower shoulder abutting a lower surface of the base plate.

5. The apparatus of claim 4, further comprising a support member attached to the board and extending toward the base plate, the body of the damping element at least partially positioned between the support member and the base plate.

6. The apparatus of claim 5, further comprising an additional one of the damping elements placed in abutting contact with the base plate proximate the end and supported by the support member.

7. A computer apparatus, comprising:
    a central processing unit (CPU);
    a board supporting the CPU;
    a heat sink contacting the CPU and supported at a location proximate to the processor, wherein an overhanging portion of the heat sink extends an overhanging length from the support location near the processor; and
    a mounting assembly supported by the board, wherein the mounting assembly comprises a resilient damping element positioned proximate to the overhanging portion, whereby energy in the overhanging portion is absorbed by the resilient damping element during dynamic loading of the computer apparatus,
    wherein the resilient damping element comprises an elastomeric body extending through a passageway through the overhanging portion of the heat sink with an upper shoulder abutting an upper surface of the heat sink and a lower shoulder abutting a lower surface of the heat sink.

8. The computer apparatus of claim 7, wherein the mounting assembly further comprises a rigid support member affixed to the board and supporting the resilient damping element in abutting contact with the overhanging portion of the heat sink.

9. The computer apparatus of claim 7, wherein the elastomeric body abuts inner sidewalls of the passageway in the overhanging portion.

10. The computer apparatus of claim 7, wherein the resilient damping element comprises at least two of the elastomeric bodies positioned in contact with the overhanging portion, whereby the overhanging portion at least partially compresses the elastomeric bodies.

* * * * *